United States Patent
Takada

(10) Patent No.: US 10,056,910 B2
(45) Date of Patent: Aug. 21, 2018

(54) OSCILLATION CIRCUIT DEVICE

(71) Applicant: SII Semiconductor Corporation, Chiba-shi, Chiba (JP)

(72) Inventor: Kosuke Takada, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 15/347,357

(22) Filed: Nov. 9, 2016

(65) Prior Publication Data

US 2017/0134029 A1    May 11, 2017

(30) Foreign Application Priority Data

Nov. 11, 2015   (JP) .................................. 2015-221430

(51) Int. Cl.
*H03L 7/06*     (2006.01)
*H03L 7/089*    (2006.01)
*H03L 7/099*    (2006.01)
*H03L 7/18*     (2006.01)

(52) U.S. Cl.
CPC ............ *H03L 7/0891* (2013.01); *H03L 7/099* (2013.01); *H03L 7/18* (2013.01)

(58) Field of Classification Search
None
See application file for complete search history.

(56) References Cited

U.S. PATENT DOCUMENTS

| | | | |
|---|---|---|---|
| 5,600,272 A * | 2/1997 | Rogers ................. | H03L 7/0891 327/103 |
| 6,300,838 B1* | 10/2001 | Kelkar ................. | H03L 7/0891 327/156 |
| 6,320,435 B1* | 11/2001 | Tanimoto ............. | H03L 7/0893 327/156 |
| 7,595,671 B2* | 9/2009 | Watanabe ............ | H03L 7/0893 327/147 |
| 8,174,332 B1 | 5/2012 | Lombaard et al. | |
| 8,212,596 B2* | 7/2012 | Furuta ................. | H03L 7/0893 327/147 |
| 8,446,139 B2* | 5/2013 | Tsukuda ............... | H03L 1/00 323/312 |
| 9,374,099 B2* | 6/2016 | Fan ....................... | H03L 7/085 |
| 2006/0006914 A1* | 1/2006 | Fan-Jiang ........... | H03L 7/113 327/156 |
| 2008/0061889 A1* | 3/2008 | Matsumoto ......... | H03L 7/087 331/11 |

(Continued)

*Primary Examiner* — Lincoln Donovan
*Assistant Examiner* — Khareem E Almo
(74) *Attorney, Agent, or Firm* — Brinks Gilson & Lione

(57) ABSTRACT

To provide an oscillation circuit device capable of when detecting an input reference signal and making a transition from a self-running state to a PLL operation, suppressing a fluctuation in the frequency of an output signal CLK to thereby obtain a smoothly-synchronized and stable output signal CLK. There is provided an oscillation circuit device which is adapted to configure a negative feedback circuit by a V/I conversion element to which one end of a filter circuit is connected, and a buffer circuit in a self-running state, and has a configuration which enables a capacitance in the filter circuit to be charged rapidly in such a manner that an output signal CLK can be started from a frequency equal to that in the self-running state immediately after a transition to a PLL operation.

3 Claims, 5 Drawing Sheets

(56) References Cited

U.S. PATENT DOCUMENTS

| | | | | |
|---|---|---|---|---|
| 2010/0264964 A1* | 10/2010 | Furuta | ............... | H03L 7/0893 327/157 |
| 2010/0277245 A1* | 11/2010 | Liu | ............... | H03L 7/0893 331/34 |
| 2011/0006820 A1* | 1/2011 | Liu | ............... | H03L 7/093 327/157 |
| 2015/0280723 A1* | 10/2015 | Fan | ............... | H03L 7/085 327/156 |

* cited by examiner

400

OSCILLATION CIRCUIT DEVICE

RELATED APPLICATIONS

This application claims priority under 35 U.S.C. § 119 to Japanese Patent Application No. 2015-221430 filed on Nov. 11, 2015, the entire content of which is hereby incorporated by reference.

BACKGROUND OF THE INVENTION

1. Field of the Invention

The present invention relates to an oscillation circuit device including a phase locked loop circuit (hereinafter referred to as a PLL circuit) which applies feedback control to an input reference signal to control the phase thereof.

2. Description of the Related Art

There has heretofore been known an oscillation circuit device which, when a reference signal from the outside is not inputted, generates and outputs an oscillation signal thereinside and when the reference signal is inputted from the outside, detects the reference signal, controls the phase thereof by a PLL circuit and outputs an oscillation signal.

A circuit diagram of a related art oscillation circuit device 400 is illustrated in FIG. 4.

The related art oscillation circuit device 400 is equipped with a power supply terminal 101, a ground terminal 102, constant current circuits 171 and 172, a PMOS transistor 122, switches 150, 151, and 154, an inverter circuit 153, a current control oscillator 113, a frequency division circuit 114, a phase frequency comparator 111, a charge pump circuit 112, a pulse detection circuit 110, and a filter circuit 174. The constant current circuit 171 is equipped with a PMOS transistor 120 and a first current source 140. The constant current circuit 172 is equipped with a PMOS transistor 121 and an NMOS transistor 131. The filter circuit 174 is equipped with a capacitance 161.

The above-described oscillation circuit device 400 has the function of performing oscillation signal switching in the following operations.

In a first mode in which a reference signal REF is not inputted to a REF terminal 103 from the outside, the pulse detection circuit 110 outputs LOW, and the switches 150 and 154 are ON, and the switch 151 is OFF. Since the PMOS transistors 120 and 122 configure a current mirror circuit through the switch 150, a drain current I1 and a current I3 of the respective PMOS transistors become currents proportional to each other. Further, the current I1 is equal to a current IB1 of the first current source 140. Consequently, the current control oscillator 113 outputs an output signal CLK of a frequency proportional to the current IB1 from a CLK terminal. Since the switch 151 is OFF in a state in which the reference signal REF inputted to the REF terminal 103 from the outside is not given, and the oscillation is made autonomously from the outside (which will be defined as a self-running state), the constant current circuit 172 does not affect the currents I1 and I3. Further, since the PMOS transistors 120 and 121 configure a current mirror circuit through the switch 150, a drain current I1 and a current I2 of the respective PMOS transistors become currents proportional to each other. At this time, since the switch 154 is ON, a gate and a drain of the NMOS transistor 131 are connected to each other, and electric charges based on the current I2 are charged in the capacitance 161. Thereafter, a gate voltage determined by the current I2 and the characteristics of the NMOS transistor 131 is generated at the gate of the NMOS transistor 131, and the current I2 flows into the NMOS transistor 131 with the completion of charging to the capacitance.

When the reference signal REF is inputted to the REF terminal 103 to enter a second mode, the pulse detection circuit 110 detects the reference signal REF and outputs HIGH to turn OFF the switches 150 and 154 and turn ON the switch 151. At this time, a PLL circuit for adjusting the phase of the reference signal REF by the phase frequency comparator 111, the charge pump circuit 112, the filter circuit 174, the constant current circuit 172, the current control oscillator 113, and the frequency division circuit 114 starts to operate. The NMOS transistor 131 which functions as a V/I conversion element V/I-converts an output voltage VCP of the charge pump circuit 112 to generate a drain current and supplies the drain current to the PMOS transistor 121. Since the PMOS transistors 121 and 122 configure a current mirror circuit, a drain current I2 and a current I3 of the respective PMOS transistors become currents proportional to each other. The current I2 in a steady state is controlled by the generally-known negative feedback operation of PLL circuit in such a manner that the frequency of the reference signal REF and the frequency of a feedback signal FB_CLK as the output of the frequency division circuit 114 become equal to each other. The current control oscillator 113 outputs an output signal CLK of a frequency proportional to the current I2 from the CLK terminal.

A technology of adding a constant current circuit to a PLL circuit and charging a capacitance of a filter circuit has been illustrated in Patent Document 1.

[Patent Document 1] U.S. Pat. No. 8,174,332 Specification

SUMMARY OF THE INVENTION

The related art oscillation circuit device 400 is however accompanied by a problem that since the charging of the capacitance 161 is performed based on the constant current, a charging time proportional to a capacitance value/constant current value becomes long. Therefore, in the related art oscillation circuit device 400 of FIG. 4, the output signal CLK may fall below a desired frequency range when the reference signal REF is inputted during charging of the capacitance to switch from the first mode to the second mode, and an external apparatus which receives the reference signal CLK therein has the risk of causing a malfunction.

FIG. 5 is a timing chart for describing changes in state in the related art oscillation circuit device 400.

FIG. 5(a) illustrates the time transition of a voltage VDD applied to the power supply terminal 101, FIG. 5(b) illustrates the time transition of the output voltage VCP of the charge pump circuit 112, FIG. 5(c) illustrates the time transition of the frequency of the reference signal REF inputted to the REF terminal 103, and FIG. 5(d) illustrates the time transition of the frequency of the output signal CLK obtained from the CLK terminal.

When the voltage VDD is applied at a time t0 as illustrated in FIG. 5(a), the voltage VCP in FIG. 5(b) is raised linearly on a straight line basis from 0V by the operation of the first mode. Thereafter, when the reference signal REF is inputted at a time t1 as illustrated in FIG. 5(c), the oscillation circuit device is transitioned to the second mode. Since the voltage VCP at this time is in a transient state, the output signal CLK obtained from the CLK terminal is outputted at a frequency determined by the value of the voltage VCP in the transient state. Consequently, as can be seen in FIG. 5(d), the output signal CLK of the CLK terminal is suddenly reduced in frequency temporarily. Afterwards, the voltage VCP is raised by the PLL operation, and the output signal CLK converges into a frequency equal to that of the reference signal REF.

The present invention has been made in view of the above-described problems and provides an oscillation circuit device capable of when detecting an input reference signal REF and making a transition from a self-running state to a PLL operation, suppressing a fluctuation in the frequency of an output signal CLK to synchronize smoothly.

In order to solve the related art problems, the oscillation circuit device of the present invention is configured as follows:

The oscillation circuit device is adapted to configure a negative feedback circuit by a V/I conversion element to which one end of a filter circuit is connected, and a buffer circuit in a self-running state, and provides a configuration which enables a capacitance in the filter circuit to be charged rapidly in such a manner that an output signal CLK can be started from a frequency equal to that in the self-running state immediately after a transition to a PLL operation.

Since the oscillation circuit device of the present invention is capable of shortening a charging time to the capacitance in the filter circuit in the self-running state, a fluctuation in the frequency of the output signal immediately after switching from the self-running state to the PLL operation can be suppressed.

DETAILED DESCRIPTION OF THE PREFERRED EMBODIMENTS

A preferred embodiment of the present invention will hereinafter be described with reference to the accompanying drawings.

Figure 1:
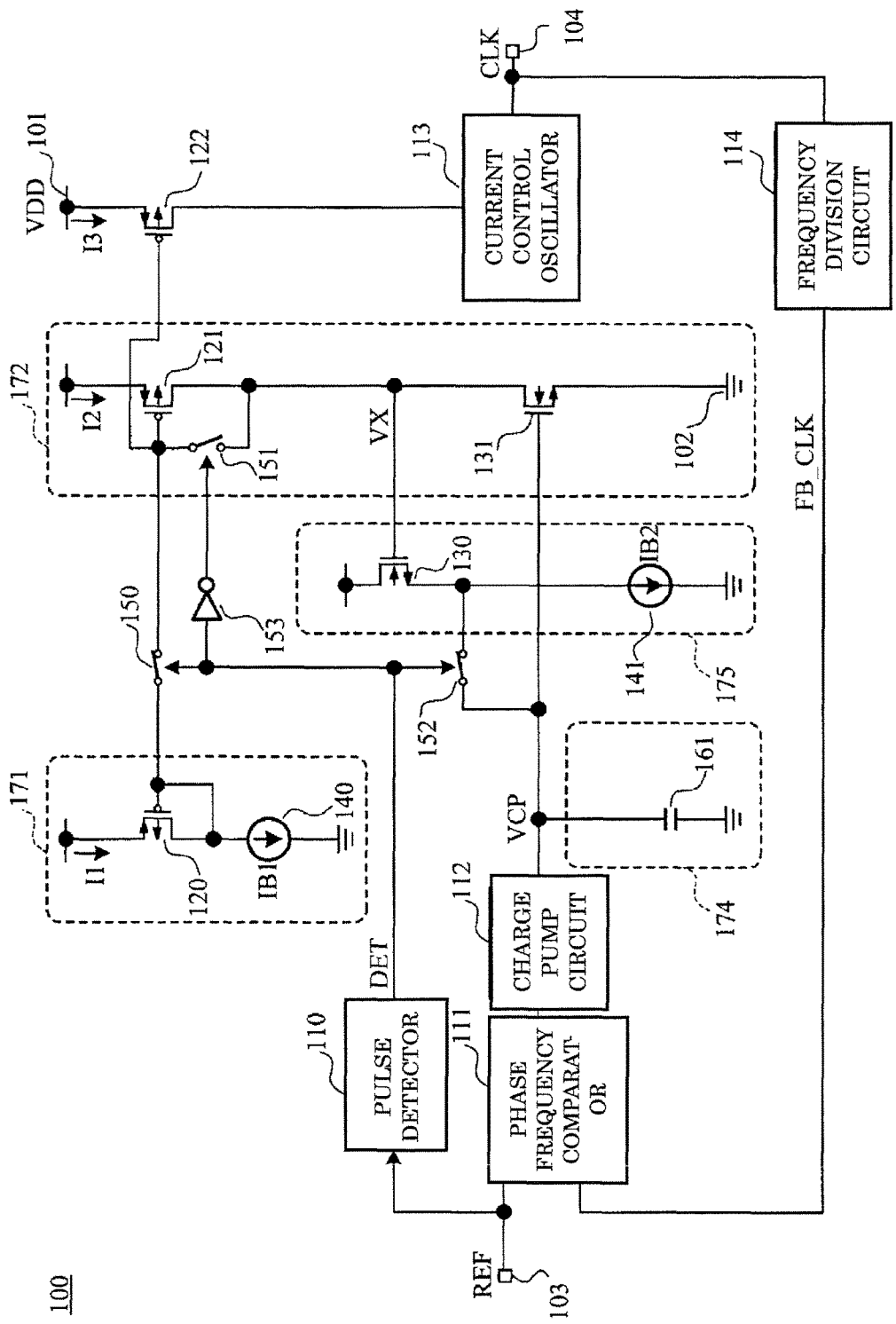
FIG. 1 is a circuit diagram illustrating a configuration of an oscillation circuit device of the present embodiment.

FIG. 1 is a circuit diagram of an oscillation circuit device 100 of the present embodiment.

The oscillation circuit device 100 of the present embodiment is equipped with a power supply terminal 101, a ground terminal 102, an REF terminal 103, a CLK terminal 104, constant current circuits 171 and 172, a PMOS transistor 122, switches 150 and 152, an inverter circuit 153, a current control oscillator 113, a frequency division circuit 114, a phase frequency comparator 111, a charge pump circuit 112, a pulse detection circuit 110, a filter circuit 174, and a buffer circuit 175. The constant current circuit 171 is equipped with a PMOS transistor 120 and a first current source 140. The constant current circuit 172 is equipped with a PMOS transistor 121, a switch 151, and an NMOS transistor 131. The filter circuit 174 is equipped with a capacitance 161. The buffer circuit 175 is equipped with an NMOS transistor 130 and a second current source 141.

The pulse detection circuit 110 detects whether or not a reference signal REF is inputted to the REF terminal 103, and outputs a signal DET. The current control oscillator 113 outputs a signal of an oscillation frequency proportional to an input current for oscillation. The phase frequency comparator 111 compares the reference signal REF and a feedback signal FB_CLK and outputs a result thereof. The charge pump circuit 112 outputs a voltage VCP, based on the output signal of the phase frequency comparator 111. The buffer circuit 175 charges the capacitance 161 earlier in time, i.e., pulls up the voltage VCP to a desired value earlier to stabilize the same. The phase frequency comparator 111, the charge pump circuit 112, the filter circuit 174, the buffer circuit 175, the constant current circuit 172, the current control oscillator 113, and the frequency division circuit 114 configure a PLL circuit for adjusting the phase of the reference signal REF inputted to the REF terminal 103.

The connection of the oscillation circuit device 100 of the present embodiment will next be described.

The pulse detection circuit 110 has an input terminal connected to the REF terminal 103, and an output terminal connected to control terminals of the switches 150 and 152 and an input terminal of the inverter circuit 153. An output terminal of the inverter circuit 153 is connected to a control terminal of the switch 151. The phase frequency comparator 111 has a first input terminal connected to the REF terminal 103, a second input terminal connected to an output terminal of the frequency division circuit 114, and an output terminal connected to an input terminal of the charge pump circuit 112. The capacitance 161 which configures the filter circuit 174 has one end connected to an output terminal of the charge pump circuit 112, and the other end connected to the ground terminal 102. The NMOS transistor 130 has a gate connected to a drain of the NMOS transistor 131 and a drain of the PMOS transistor 121, a drain connected to the power supply terminal 101, and a source connected to one end of the switch 152 and one end of the second current source 141. The second current source 141 has the other end connected to the ground terminal 102. The switch 152 has the other end connected to the output terminal of the charge pump circuit 112. The NMOS transistor 131 has a gate connected to the output terminal of the charge pump circuit 112, and a source connected to the ground terminal 102. The PMOS transistor 120 has a source connected to the power supply terminal 101, and a gate and a drain connected to one end of the switch 150 and one end of the first current source 140. The first current source 140 has the other end connected to the ground terminal 102. The PMOS transistor 121 has a source connected to the power supply terminal 101, and a gate connected to the other end of the switch 150. The switch 151 has one end connected to the gate of the PMOS transistor 121, and the other end connected to the drain of the PMOS transistor 121. The PMOS transistor 122 has a source connected to the power supply terminal 101, a gate connected to the gate of the PMOS transistor 121, and a drain connected to an input terminal of the current control oscillator 113. The current control oscillator 113 has an output terminal connected to an input terminal of the frequency division circuit 114.

The operation of the oscillation circuit device 100 of the present embodiment will next be described.

A description will first be made about a first mode in a state in which the reference signal REF is not inputted to the REF terminal 103.

In the first mode, the pulse detection circuit 110 outputs a signal DET indicative of non-detection to turn ON the switches 150 and 152 and turn OFF the switch 151. The constant current circuit 171 makes a constant current IB1 of the first constant current source 140 to flow. Since the PMOS transistor 122 configures a current mirror circuit with the PMOS transistor 120, a drain current I1 and a current I3 of the respective PMOS transistors become currents proportional to each other. For example, when the size ratio of the PMOS transistors 120 and 122 is 1:1, the current I1 and the current I3 become equal to each other. The current control oscillator 113 outputs an output signal CLK of a frequency proportional to the input current I3, i.e., the current IB1 from the CLK terminal. That is, the frequency of the output signal CLK is arbitrarily determined by the current value of the current IB1 or the size ratio of the PMOS transistors 120 and 122.

Further, since the PMOS transistor 121 configures a current mirror circuit with the PMOS transistor 120, a drain current I1 and a current I2 of the respective PMOS transistors become currents proportional to each other. For example, when the size ratio of the PMOS transistors 120 and 121 is 1:1, the current I1 and the current I2 become equal to each other. With this current I2, a gate voltage VX of the NMOS transistor 130 is raised so that the NMOS transistor 130 is turned ON. Then, the capacitance 161 is charged by a source current of the NMOS transistor 130 so that the voltage VCP is raised. Thus, when the NMOS transistor 131 which receives the voltage VCP at its gate is turned ON, the constant current circuit 172 and the buffer circuit 175 configure a negative feedback circuit. Therefore, the VCP made to be a gate voltage of the NMOS transistor 131 is suddenly pulled up in such a manner that the drain current of the NMOS transistor 131 and the current I2 become equal to each other. In a steady state after this, the drain current of the NMOS transistor 130 of the buffer circuit 175 and a constant current IB2 of the second constant current source 141 become equal to each other, and hence the second constant current source 141 operates as a pull-down element.

As described above, since the oscillation circuit device 100 of the present embodiment is equipped with the buffer circuit 175, the capacitance 161 can be charged earlier in the first mode, i.e., the voltage VCP can be pulled up to a desired voltage value earlier. It is therefore possible to stabilize the frequency of the output signal CLK promptly.

A description will next be made about a second mode in a state in which the reference signal REF is inputted to the REF terminal 103.

When the first mode is switched to the second mode, the pulse detection circuit 110 outputs a signal DET indicative of detection to turn OFF the switches 150 and 152 and turn ON the switch 151 through the inverter circuit 153. Since the switch 150 is turned OFF, the constant current circuit 171 is separated from the oscillation circuit device 100. Since the switch 151 is turned OFF, the buffer circuit 175 is separated from the filter circuit 174. Further, since the switch 151 is turned ON, the PMOS transistor 121 and the PMOS transistor 122 configure a current mirror circuit, and a drain current I2 and a current I3 of the respective PMOS transistors become currents proportional to each other. For example, when the size ratio of the PMOS transistors 121 and 122 is 1:1, the current I2 and the current I3 become equal to each other.

The NMOS transistor 131 which functions as a V/I conversion element WI-converts the output voltage VCP of the charge pump circuit 112, which is outputted based on the oscillation frequency of the reference signal REF to generate a drain current, and supplies the same to the PMOS transistor 121. The current I2 in the steady state is controlled by a negative feedback operation of the PLL circuit in such a manner that the frequency of the reference signal REF and the frequency of the feedback signal FB_CLK as the output of the frequency division circuit 114 become equal to each other. More specifically, the reference signal REF and the feedback signal FB_CLK are compared with each other by the phase frequency comparator 111, and the voltage VCP is outputted from the charge pump circuit 112 and the filter circuit 174, whereby the current I2 is generated by the NMOS transistor 131. Thus, the current control oscillator 113 outputs an output signal CLK of a frequency based on the voltage VCP from the CLK terminal. Since the switch 150 is OFF, the constant current circuit 171 does not affect the current I2 and the current I3.

Figure 2:
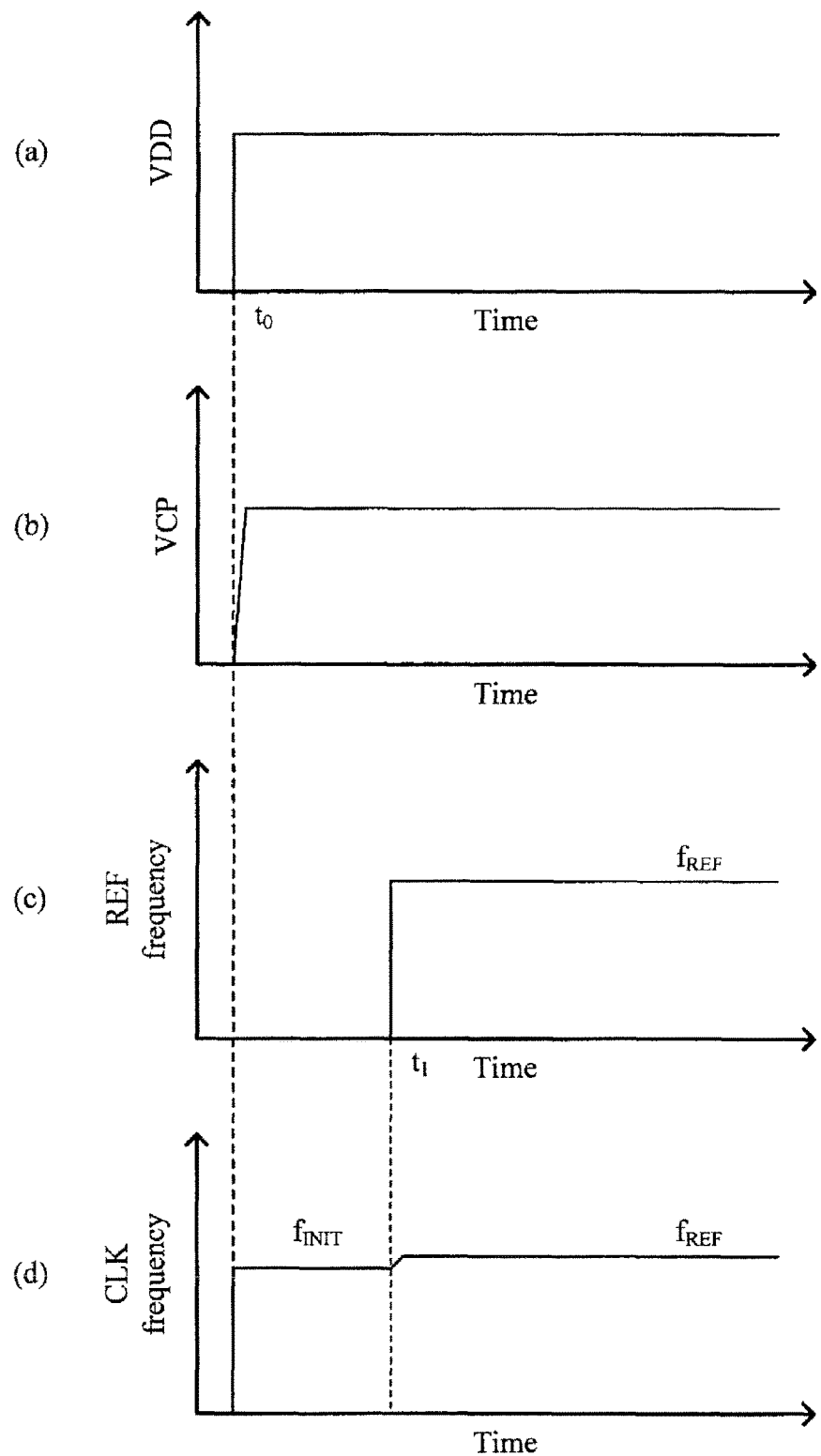
FIG. 2 is a timing chart illustrating an output signal in the oscillation circuit device of the present embodiment.

FIG. 2 is a timing chart for describing changes in state in the oscillation circuit device 100 of the present embodiment. The effects of the present embodiment will be described using FIG. 2.

FIG. 2(a) illustrates the time transition of a voltage VDD applied to the power supply terminal 101, FIG. 2(b) illustrates the time transition of the output voltage VCP of the charge pump circuit 112, FIG. 2(c) illustrates the time transition of the frequency of the reference signal REF inputted to the REF terminal 103, and FIG. 2(d) illustrates the time transition of the frequency of the output signal CLK obtained from the CLK terminal.

When the voltage VDD is applied at a time t0 as illustrated in FIG. 2(a), the oscillation circuit device 100 is operated in the first mode because the reference signal REF is not inputted to the REF terminal 103, and hence the output voltage VCP is rapidly raised from 0V by the negative feedback operation of the constant current circuit 172 and the buffer circuit 175.

Thereafter, when the reference signal REF is inputted at a time t1 as illustrated in FIG. 2(c), the oscillation circuit device 100 is transitioned to a second mode. At this time, since the current control oscillator 113 is being operated by the current corresponding to the voltage VCP which has already reached a steady value, the output signal CLK of the CLK terminal does not cause a sudden reduction in frequency. Afterwards, the output signal CLK converges into a frequency equal to that of the reference signal REF by a PLL operation.

As described above, since the oscillation circuit device 100 of the present embodiment is configured to pull up the voltage of the capacitance 161 in the filter circuit 174 by the output of the buffer circuit 175 which performs the negative feedback operation by virtue of the constant current circuit 172, the oscillation circuit device 100 is capable of shortening a charging period to the capacitance 161 and suppressing a fluctuation in output frequency immediately after being switched from its self-running state to the PLL operation.

Figure 3:
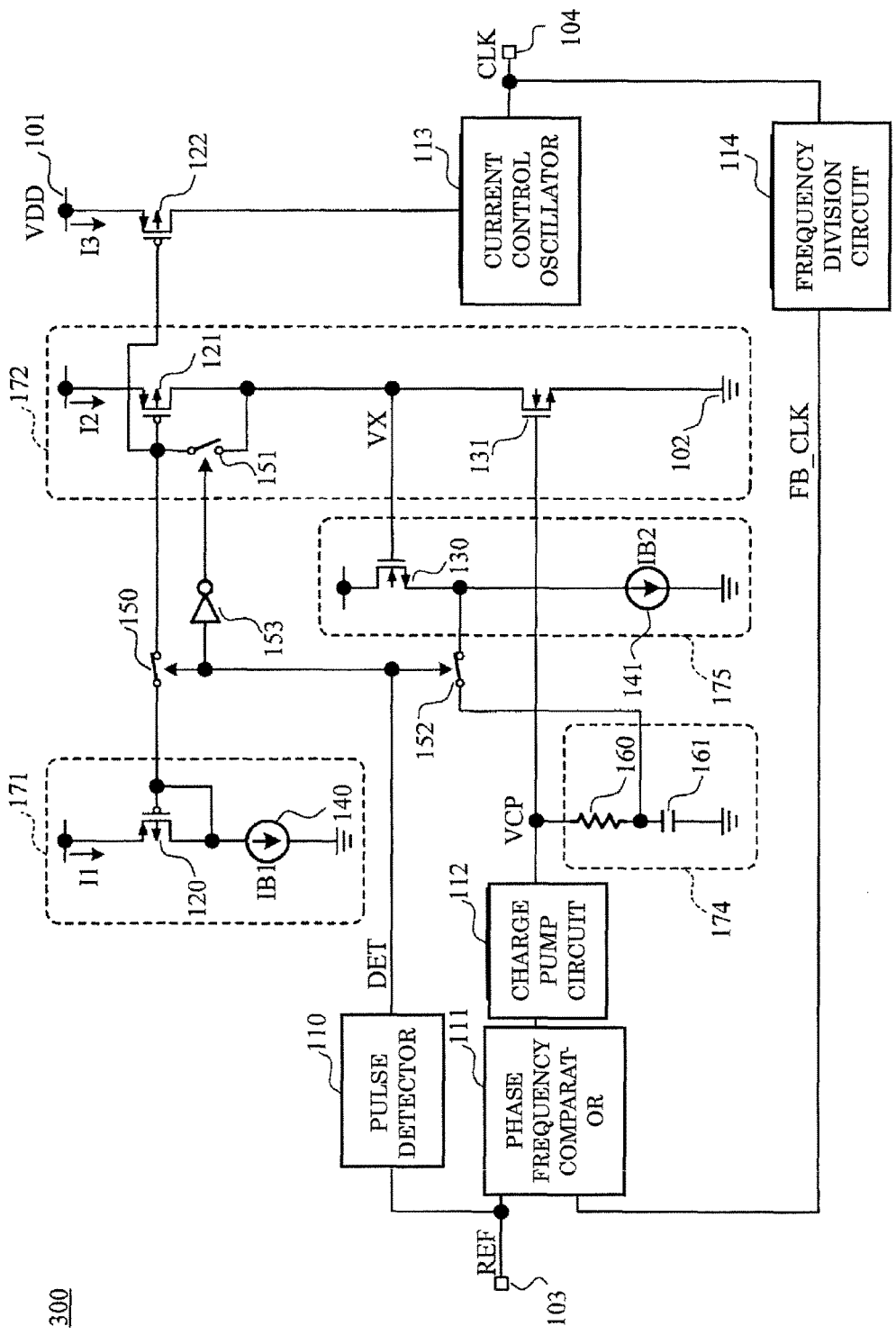
FIG. 3 is a circuit diagram illustrating another configuration of the oscillation circuit device of the present embodiment.
Figure 4:
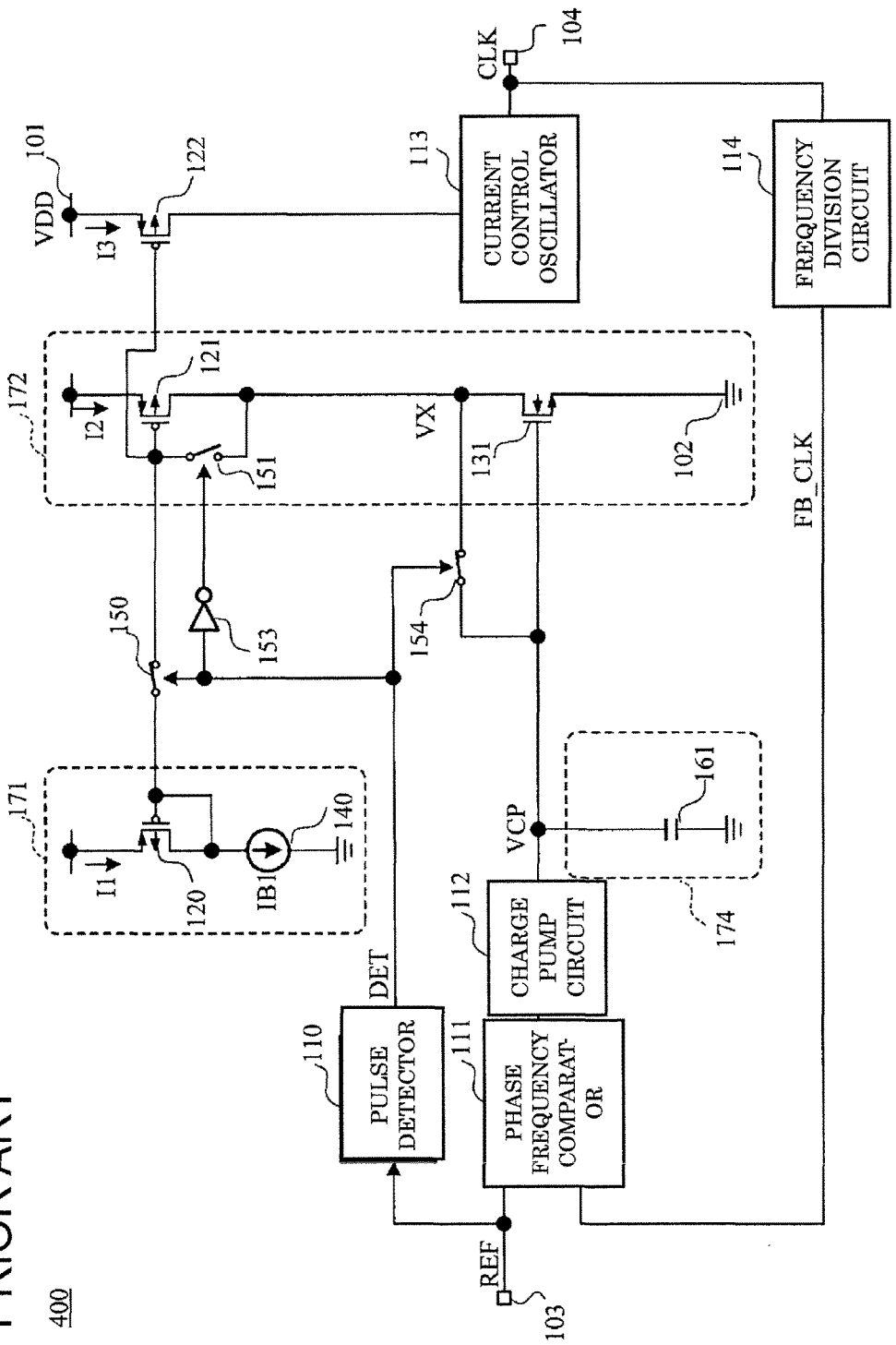
FIG. 4 is a circuit diagram illustrating a configuration of a related art oscillation circuit device.
Figure 5:
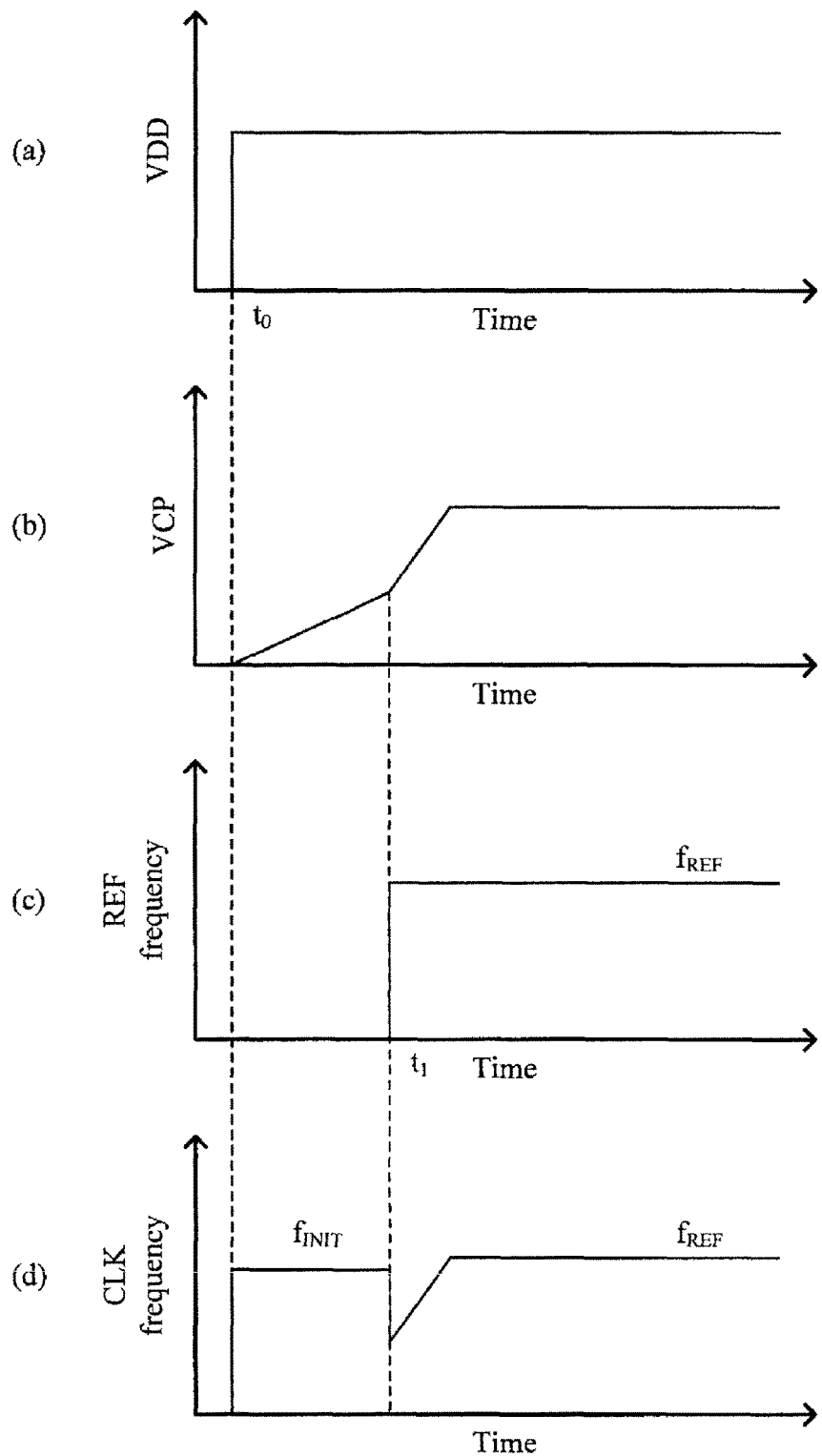
FIG. 5 is a timing chart illustrating an output signal in the related art oscillation circuit device.

FIG. 3 is a circuit diagram illustrating another configuration of the oscillation circuit device of the present embodiment.

An oscillation circuit device 300 is configured to provide a resistor 160 in a filter circuit 174.

The resistor 160 has one end connected to an output terminal of a charge pump circuit 112, and the other end connected to the other ends of a capacitance 161 and a switch 152.

Thus, as phase compensation of a PLL circuit, there is a case where the resistor 160 is provided in the filter circuit 174. Such a filter circuit 174 can also obtain an effect similar to that described above by connecting an output terminal of a buffer circuit 175 between the capacitance 161 and the resistor 160 through the switch 152.

As described above, the oscillation circuit device of the present embodiment is capable of while improving frequency characteristics by inserting the phase compensation resistor 160, easily making even shortening of the charging time to the capacitance 161 compatible with the improvement in the frequency characteristics by connecting the output terminal of the buffer circuit 175 to the capacitance 161. It is thus possible to suppress a sudden reduction in the output frequency immediately after switching from a self-running state to a PLL operation, and prevent the malfunction of an external apparatus connected to a CLK terminal.

Incidentally, any type of circuit configuration in which not only a resistor but also other elements are connected to the capacitance 161 is capable of obtaining a similar effect.

Further, it is needless to say that the oscillation circuit device of the present invention can be applied to various electronic apparatuses operated by switching the self-running state and the reference signal REF inputted from the outside. For example, when it is desired to adopt such a configuration that an oscillation frequency of a DC/DC converter is freely changed from the outside, the oscillation circuit device of the present invention is adopted to thereby make it possible to realize a smooth transition of an oscillation signal and provide a DC/DC converter having a stable operation.

What is claimed is:

1. An oscillation circuit device comprising:
    an oscillator including:
        a first constant current circuit that causes a first constant current to flow,
        a second constant current circuit connected to the first constant current circuit by a first switch and that causes a second constant current to flow,
        a current mirror circuit that causes an oscillating current proportional to the first constant current or the second constant current to flow, a current control oscillator configured to change a frequency of an oscillation signal output according to a current value of the oscillating current input thereto;
    a PLL circuit including:
        a phase frequency comparator which compares a phase of a reference signal and a phase of the oscillation signal,
        a charge pump circuit that receives an output of the phase frequency comparator,
        a filter circuit including a capacitance that receives an output of the charge pump circuit, and
        a frequency division circuit that divides the output of the current control oscillator,
        the PLL circuit controlling the second constant current by an output voltage of the charge pump circuit; and
    a buffer circuit that receives an output voltage of the second constant current circuit as an input voltage and charges the capacitance of the filter circuit through a second switch,
    wherein the oscillation circuit device is configured to output the oscillation signal based on the first constant current of the oscillator in a first mode in which the reference signal is not input, and output the oscillation signal based on the second constant current of the oscillator in a second mode in which the reference signal is input,
    wherein in the first mode, the oscillation circuit device is configured to turn ON the second switch and thereby charge the capacitance by an output voltage of the buffer circuit, and
    wherein in the second mode, the oscillation circuit device is configured to turn OFF the second switch.

2. The oscillation circuit device according to claim 1, wherein the first constant current circuit comprises a first PMOS transistor and a constant current element connected in series,
    wherein the second constant current circuit comprises a second PMOS transistor and a first NMOS transistor connected in series,
    wherein a gate of the first PMOS transistor is connected to the second PMOS transistor through the first switch, and a gate of the first NMOS transistor is connected to the filter circuit,
    wherein in the first mode, the first switch is turned ON to cause the second constant current circuit to generate a current proportional to the current of the first constant current circuit, and
    wherein in the second mode, the first switch is turned OFF to generate a current based on a phase difference between a frequency of the reference signal and the frequency of the oscillation signal.

3. The oscillation circuit device according to claim 2, comprising:
    a pulse detection circuit which detects that the reference signal is inputted,
    wherein the pulse detection circuit controls the first switch and the second switch according to an output signal thereof.

* * * * *